United States Patent
Pioro-Ladriere et al.

(10) Patent No.: US 8,222,629 B2
(45) Date of Patent: Jul. 17, 2012

(54) ELECTRONIC DEVICE USING QUANTUM DOT

(75) Inventors: Michel Pioro-Ladriere, Isehara (JP); Toshiaki Obata, Isehara (JP); Yun-Sok Shin, Atsugi (JP); Toshihiro Kubo, Atsugi (JP); Seigo Tarucha, Tokyo (JP)

(73) Assignee: Japan Science and Technology Agency (JP)

( * ) Notice: Subject to any disclaimer, the term of this patent is extended or adjusted under 35 U.S.C. 154(b) by 186 days.

(21) Appl. No.: 12/746,599

(22) PCT Filed: Dec. 4, 2008

(86) PCT No.: PCT/JP2008/072035
§ 371 (c)(1),
(2), (4) Date: Jun. 29, 2010

(87) PCT Pub. No.: WO2009/072550
PCT Pub. Date: Jun. 11, 2009

(65) Prior Publication Data
US 2010/0270534 A1 Oct. 28, 2010

(30) Foreign Application Priority Data
Dec. 7, 2007 (JP) .................. 2007-316648

(51) Int. Cl.
*H01L 29/12* (2006.01)
(52) U.S. Cl. .................. 257/14; 257/E29.168
(58) Field of Classification Search ........... 257/14, 257/E29.168
See application file for complete search history.

(56) References Cited

U.S. PATENT DOCUMENTS
2005/0276149 A1* 12/2005 Allenspach et al. ......... 365/232

FOREIGN PATENT DOCUMENTS
JP 2004-533107 10/2004

OTHER PUBLICATIONS

Loss et al., Quantum computation with quantum dots, Physical Review A, vol. 57, No. 1, Jan. 1998, pp. 120-126, The American Physical Society.
Petta et al., Coherent Manipulation of Coupled Electron Spins in Semiconductor Quantum Dots, Science, vol. 309, Sep. 30, 2005, pp. 2180-2184.

(Continued)

*Primary Examiner* — Jami M Valentine
(74) *Attorney, Agent, or Firm* — Bacon and Thomas, PLLC

(57) ABSTRACT

An electronic device using quantum dots, which comprises a ferromagnetic micro magnet and performs individual ESR control on each multi-quantum bit in a power saving way.

The electronic device comprising the ferromagnetic micro magnet (10) disposed in the vicinity of the quantum dots (8, 9) of a plurality of aligned semiconductor quantum dots, wherein a strong magnetic field is applied so as to induce electron spin resonance (ESR), and the layout of the ferromagnetic micro magnet (10) is changed, thereby controlling the resonance frequency of the quantum dots (8, 9). Under the condition where the resonance frequency of each quantum dot (8, 9) is controlled, swapping of the electron spins in the quantum dots (8, 9) is performed, thereby creating a quantum bit (QUBIT) required for quantum calculation.

40 Claims, 8 Drawing Sheets

OTHER PUBLICATIONS

Koppens et al., Driven coherent oscillations of a single electron spin in a quantum dot, Nature, vol. 442, Aug. 17, 2006, pp. 766-771.

Nowack et al., Coherent Control of a Single Electron Spin with Electric Fields, Science, vol. 318, Nov. 30, 2007, pp. 1430-1433.

Laird et al., Hyperfine-Mediated Gate-Driven Electron Spin Resonance, Physical Review Letters, vol. 99, Dec. 14, 2007, pp. 246601-1-246601-4, The American Physical Society.

Ono et al., Current Rectification by Pauli Exclusion in a Weakly Coupled Double Quantum Dot System, Science, vol. 297, Aug. 23, 2002, pp. 1313-1317.

Tarucha et al., Shell Filling and Spin Effects in a Few Electron Quantum Dot, Physical Review Letters, vol. 77, No. 17, Oct. 21, 1996, pp. 3613-3816, The American Physical Society.

Pioro-Ladriere et al, Micromagnets for coherent control of spin-charge qubit in lateral quantum dots, Applied Phusics Letters, vol. 99, 2007, pp. 024105-1-024105-3.

Kim et al., Engineering Quantum Confinement and Orbital Couplings in Laterally Coupled Vertical Quantum Dots for Spintronic Applications, IEEE Transactions on Nanotechnology, vol. 55, No. 4, Jul. 2006, pp. 343-349.

* cited by examiner

US 8,222,629 B2

ELECTRONIC DEVICE USING QUANTUM DOT

TECHNICAL FIELD

The present invention relates to an electronic device having a plurality of coupled quantum dots, which is a powerful candidate for realizing quantum calculation and quantum information processing.

BACKGROUND ART

A method for performing quantum calculation, in which multiple quantum bits are formed by using a semiconductor quantum dot structure having a plurality of aligned semiconductor quantum dots, has conventionally been proposed. As the method for forming multiple quantum bits by using semiconductor quantum dots, a method that uses electron spin has been proposed. Electron spin under a strong magnetic field behaves basically as a two-level system, so that an electron spin-up state and an electron spin-down state are related to a one bit state. A method that uses electron spin resonance (ESR) to manipulate bits has also been proposed. For example, it has been proposed to carry out quantum calculation by irradiating quantum dots with a high-frequency magnetic field under a strong magnetic field, determining an electron spin state by ESR control, and then changing an interaction between the quantum dots (see Non-Patent Documents 1, 2, and 3 below).

As a method for controlling ESR of electron spin in semiconductor quantum dots, a method for applying microwaves to a micro coil formed above quantum dots (see Non-Patent Document 3), and a method for directly applying microwaves to a control electrode (see Non-Patent Documents 4 and 5) have been proposed.

A conventional method for controlling ESR of electron spin in semiconductor quantum dots will be described below in accordance with Non-Patent Document 3.

FIG. 1 shows a top view of a conventional electronic device using quantum dots. FIG. 2 shows a schematic side view of the electronic device.

As shown in FIGS. 1 and 2, when an aluminum gallium arsenide crystal layer (AlGaAs) 12 is epitaxially grown on a gallium arsenide (GaAs) crystal substrate 11, a two-dimensional electron gas layer (2DEG layer) 13 with a thickness of about 10 nm is formed at the heterojunction interface between these two crystals. This 2DEG layer 13 is located approximately 100 nm below the surface of the AlGaAs crystal layer 12 which is an epitaxial layer of AlGaAs. Gate electrodes 2, 3, 4, and 5, i.e. a quantum dot coupling control electrode 2, a right electrode for forming a quantum dot 3, a left electrode for forming a quantum dot 4, a center gate electrode 5, are formed on the AlGaAs crystal layer 12. When a negative voltage is applied to the gate electrodes 2, 3, 4, and 5, a depletion layer extends from just beneath them. Each depletion layer extends to the 2DEG layer 13, and as the magnitude of the negative voltage applied to the gate electrodes 2, 3, 4, and 5 is increased, the 2DEG layer 13 loses electron carriers from the parts reached by the depletion layer. When the negative applied voltage is further increased, electron carriers remain only in an island-shaped (almost disc-shaped) portions in the 2DEG layer 13, which are a quantum dot 8 and a quantum dot 9. Then, a calixarene insulating film 14 is deposited on the upper surface of a semiconductor crystal substrate 1. A pattern of a high-frequency micro coil 34 is formed on the calixarene insulating film 14, by the electron beam vacuum evaporation method, so as to be 90 nm away from the surfaces of the gate electrodes 2, 3, 4, and 5. Adjusting the voltages applied to the gate electrodes 2, 3, 4, and 5 allows both quantum dots 8 and 9 to have only a single electron. Then, an external magnetic field 17 is applied to fix the energy state of electron spin.

In order to form a quantum bit by using this conventional electronic device, electron spin information of all quantum dots is initialized, and then the information is written into a first quantum dot by using ESR control (N). A high-frequency magnetic field is induced by applying a high-frequency current to the high-frequency micro coil 34 shown in FIGS. 1 and 2, then electron spin in the quantum dot 8 is manipulated by the ESR control. The ESR control will be described with reference to energy diagrams shown in FIG. 3. FIG. 3(a) to FIG. 3(c) show time-dependent changes of electron spin states during the ESR control. 35 shows an energy state of a drain electrode and 36 shows an energy state of a source electrode. The shaded portion is filled with electrons, so that electrons in the energy states below the uppermost plane do not flow. 37 shows a tunneling barrier, 38 shows a spin-up electron spin in the ground state, and 39 shows a spin-down electron spin in the excited state.

Electrons are first injected into the quantum dot 8 on the left side by electrode operation. After sufficiently long time (1 millisecond to 1 second), electron spins in both quantum dots 8 and 9 are aligned, and no current flows according to the Pauli principle (see Non-Patent Document 6). That is, in FIG. 3 (a), 40 indicates that no current is flowing between the quantum dots 8 and 9, showing that the electron spin information is initialized. Then a high-frequency magnetic field is applied to perform the ESR control. As shown in FIG. 3 (b), the ESR control reverses the electron spin 39. If a tunneling probability between the quantum dots is high enough, the fact that the ESR control has been performed can be observed as a current flow 16 between the quantum dots, as shown in FIG. 3 (c). In this way, it is confirmed that electron spin states are changed by the ESR control.

To fabricate multiple quantum bits by using the conventional electronic device, it is necessary to precisely control a coupling state of electron spin between quantum dots and to rapidly control the electron spin in the quantum dot (B). FIG. 4 shows a method for controlling a coupling state between electron spin in accordance with Non-Patent Document 2. This device is nearly the same as that shown in FIGS. 1 and 2, so that it will be described in reference with these figures. As shown in FIG. 4 (a), two electron spins 38 and 39 are assumed to be oppositely directed in the initial state. Differing from the description (A) given above, it is assumed that the energy states of the electron spins 38 and 39 are lower than the energy states 35 and 36 of the drain electrode and the source electrode, respectively, and that no current is flowing. An interaction 20 between the electron spins can be enhanced by increasing a voltage applied to the left gate electrode 4 for forming a quantum dot by a small amount without causing electric charge transfer, or by relatively decreasing the influence of the depletion layer under the center gate electrode 5, before the electron spins 38 and 39 are aligned due to electron spin relaxation and electron spin block occurs, as shown in FIG. 4 (b). Then, the electron spins interact with each other and become in the aligned state, as shown in FIG. 4 (c). In this way, the electrons interact with each other and alternate between a spin aligned state and a spin opposed state. The direction of the electron spin can always be reversed by keeping the interaction time constant. This operation indicates a logical NOT operation. It may seemingly easy to realize a quantum bit and perform quantum calculation by combining (A) and (B) described above.

Non-Patent Document 1: Loss, D. & DiVincenzo D. P., Quantum computation with quantum dots. Phys. Rev. A57, pp. 120-126 (1998).

Non Patent Document 2: Petta, J. R. et al., Coherent manipulation of coupled electron spins in semiconductor quantum dots, Science 309, pp. 2180-2184 (2005).

Non-Patent Document 3: Koppens, F. H. L. et al., Driven coherent oscillations of a single electron spin in a quantum dot, Nature 442, pp. 766 (2006).

Non-Patent Document 4: Nowack, K. C. et al., Coherent Control of a Single Electron Spin with Electric Fields, Science Published Online Nov. 1 (2007)

Non-Patent Document 5: Laird E. A. et al., http://arxiv.org/abs/0707.0557 (2007)

Non-Patent Document 6: Ono, K. et al., Current rectification by Pauli exclusion in a weakly coupled double quantum dot system, Science 297, pp. 1313-1317 (2002)

Non-Patent Document 7: Tarucha et al., Phys. Rev. Lett. 77, pp. 3613 (1996).

Disclosure Of Invention

However, in order to form multiple quantum bits comprising a plurality of quantum dots, it is necessary to perform ESR control rapidly, precisely and individually on electron spin in each quantum dot.

In the conventional ESR control methods, however, rapid electron spin in all quantum dots are controlled only in uniform and simultaneous way, having difficulties in realizing multiple bits.

In view of the situation described above, an object of the present invention is to provide an electronic device using quantum dots, which comprises a ferromagnetic magnet, and can carry out quantum calculation by performing ESR control on each multiple quantum bit individually in a power saving way.

To fulfill the above object, the present invention provides:

[1] An electronic device using quantum dots, comprising a ferromagnetic magnet disposed in the vicinity of each quantum dot of a plurality of aligned semiconductor quantum dots and transforming a high frequency electric field into a high frequency magnetic field, wherein the ferromagnetic magnet is a ferromagnetic thin film that is disposed on the quantum dots with a dielectric material therebetween.

[2] The electronic device of [1], wherein a frequency of the high frequency electric field is 1.6 GHz and more and 300 GHz or less.

[3] The electronic device of [2], wherein a frequency of the high frequency electric field is 1.6 GHz and more and 3 GHz or less.

[4] The electronic device of [2], wherein a frequency of the high frequency electric field is 3 GHz and more and 30 GHz or less.

[5] The electronic device of [2], wherein a frequency of the high frequency electric field is 30 GHz and more and 300 GHz or less.

[6] The electronic device of [1], wherein the ferromagnetic thin film is made from cobalt or cobalt alloy containing 50% and more of cobalt.

[7] The electronic device of [6], wherein a thickness of the ferromagnetic thin film is from 0.05 µm to 1 µm, a width of the ferromagnetic thin film is from 0.3 µm to 0.4 µm, and a length of the ferromagnetic thin film is 1 µm.

[8] The electronic device of [1], wherein the ferromagnetic thin film is made from nickel or nickel alloy containing 50% and more of nickel.

[9] The electronic device of [8], wherein a thickness of the ferromagnetic thin film is from 0.15 µm to 3 µm, a width of the ferromagnetic thin film is from 0.3 µm to 0.4 µm, and a length of the ferromagnetic thin film is 1 µm.

[10] The electronic device of [1], wherein the ferromagnetic thin film is made from dysprosium or dysprosium alloy containing 50% and more of dysprosium.

[11] The electronic device of [10], wherein a thickness of the ferromagnetic thin film is from 0.025 µm to 1 µm, a width of the ferromagnetic thin film is from 0.3 µm to 0.4 µm, and a length of the ferromagnetic thin film is 1 µm.

[12] The electronic device of [1], wherein the ferromagnetic thin film is made from iron or iron alloy containing 50% and more of iron.

[13] The electronic device of [12], wherein a thickness of the ferromagnetic thin film is from 0.025 µm to 1 µm, a width of the ferromagnetic thin film is from 0.3 µm to 0.4 µm, and a length of the ferromagnetic thin film is 1 µm.

[14] The electronic device of [1], wherein the ferromagnetic thin film is made from chromium or chromium alloy containing 50% and more of chromium.

[15] The electronic device of [14], wherein a thickness of the ferromagnetic thin film is from 0.025 µm to 1 µm, a width of the ferromagnetic thin film is from 0.3 µm to 0.4 µm, and a length of the ferromagnetic thin film is 1 µm.

[16] The electronic device of [1], wherein a gradient magnetic field and a parallel magnetic field with respect to the surface of the quantum dots are generated due to a magnetic field generated by the ferromagnetic thin film.

[17] The electronic device of [1], wherein an energy state of electron spin in each quantum dot is changed by applying a strong external magnetic field under an ultra-low temperature, and each quantum dot has an individual energy state by the action of the parallel magnetic field.

[18] The electronic device of [16], wherein an electron disposed in the vicinity of the quantum dots are electrically driven under the influence of the gradient magnetic field, and electron spin resonance is realized.

[19] The electronic device of [18], wherein an electron spin state can be manipulated to be a spin-up state and a spin-down state by the electron spin resonance, and the electron spin state is related to a bit, thereby setting a quantum bit

[20] The electronic device of [1], wherein each quantum dot has a different energy state by the action of the ferromagnetic magnet.

[21] The electronic device of [1], wherein electron spin can be manipulated independently by applying a high frequency electric field with different frequency to each quantum dot, according to the electron spin resonance principle.

[22] The electronic device of [1], wherein electrons present in the quantum dots mutually form an electronic coupling state.

[23] The electronic device of [1], further comprising a control electrode disposed halfway between the quantum dots, wherein a coupling state of electrons is controlled by applying a voltage to the control electrode to extend or contract a depletion layer under the control electrode.

[24] The electronic device of [23], wherein quantum calculation is performed by manipulating the coupling state of electrons.

[25] The electronic device of [1], wherein each quantum dot has a horizontal quantum dot structure with a gate electrode for forming a quantum dot, the gate electrode being disposed on a surface of a semiconductor crystal substrate, the substrate having a two-dimensional electron gas layer at a heterojunction interface between a gallium arsenide and an aluminum gallium arsenide.

[26] The electronic device of [1], wherein each quantum dot has a horizontal quantum dot structure with a gate electrode for forming a quantum dot, the gate electrode being disposed on a surface of a semiconductor crystal substrate, the substrate having a two-dimensional electron gas layer at a heterojunction interface between a silicon and a silicon germanium.

[27] The electronic device of [25] or [26], wherein each quantum dot has a vertical quantum dot structure in which the two-dimensional electron gas layer is geometrically cut out and a metallic electrode is disposed on the periphery of the cut out layer.

[28] The electronic device of [1], wherein the ferromagnetic magnet is made from a ferromagnetic metal, an oxide ferromagnetic metal, a superconductive metal, or an oxide superconductive metal.

[29] The electronic device of [1], wherein a distance from the ferromagnetic magnet to each semiconductor quantum dot is different.

[30] The electronic device of [29], wherein the distance from the ferromagnetic magnet to each semiconductor quantum dot varies from 0.15 µm to 0.5 µm, and a thickness of the ferromagnetic magnet is 0.1 µm.

[31] The electronic device of [1], wherein a thickness of the ferromagnetic magnet in the nearest neighborhood of each quantum dots is varied.

[32] The electronic device of [31], wherein a thickness of the ferromagnetic magnet varies from 0.025 µm to 1 µm.

[33] The electronic device of [23], [25], or [26], wherein a dielectric film is disposed between the ferromagnetic magnet and the electrodes or the gate electrodes for forming a quantum dot.

[34] The electronic device of [33], wherein the dielectric film is an electron beam lithography resist, a photoresist or silicon dioxide, or silicon nitride.

[35] The electronic device of [23], wherein the dimensions of the ferromagnetic magnet, the control electrode, and the gate electrodes for forming a quantum dot are changed uniformly so as to provide the same function only by changing a magnitude of applied voltage.

[36] The electronic device of [1], further comprising a control electrode, an electrode for forming a quantum dot, and a readout quantum point contact gate electrode in the vicinity of the semiconductor quantum dots, and further comprising a quantum point contact exhibiting one dimensional quantized electron conduction phenomenon.

[37] The electronic device of [1], further comprising a quantum point contact which changes its conductivity depending on the number of electric charges in the neighboring quantum dots.

[38] The electronic device of [1], wherein readout of an electron spin state is performed by means of detection of an electron coupling state between the quantum dots and an electric charge.

[39] The electronic device of [1], wherein an electron spin polarized current utilizing electron spin alignment due to a leakage magnetic field can be injected in the vicinity of the ferromagnetic thin film.

[40] The electronic device of [1], wherein a flip-flop operation can be performed by controlling an electron spin state of each quantum dot uniquely.

[41] The electronic device of [17], wherein quantum calculation can be performed by controlling a coupling state between the electron spins.

In other words, the present invention provides:

[A] A electric device using quantum dots, comprising a structure in which a dielectric film such as an electron beam resist is deposited on top surfaces of gate electrodes forming a plurality of quantum dots, and a ferromagnetic magnet is disposed on the dielectric film. A component, which is perpendicular to a surface of a two-dimensional electron gas layer (2DEG), of a local magnetic field produced by the ferromagnetic magnet, generates a gradient magnetic field. When a high-frequency electric field is applied to electrons in the gradient magnetic field, the electrons are electrically oscillated, and the oscillations produce a high-frequency magnetic field that is necessary for performing ESR control. The present invention achieves the same effect as the micro coil method of Non-Patent Document 3 in which a magnetic field is induced by current, in at least 10 times more power saving way.

[B] The electronic device of [A], wherein a magnetic field component, which is generated by the ferromagnetic magnet and parallel to the 2DEG plane, changes the local magnetic field intensity to which an electron spin is subject. The magnetic field component has a magnitude of approximately 1 to 10% of an externally applied strong magnetic field. The magnetic field component changes electron spin energy by approximately 1 to 10% The changes in the local magnetic field intensity and the modulation of the electron spin energy can be controlled by changing a layout and a structure of the ferromagnetic magnet. Since the electron spin energy corresponds to a frequency of the high-frequency electric field described in [A], changing the frequency of the high-frequency electric field allows selective manipulation of the electron spin.

[C] The electronic device of [A], wherein an electron in each quantum dot mutually forms an electronic coupling state. In the electronic coupling state between electrons, an exchange interaction between electron spins (a coupling state between electron spins) can be controlled freely, by applying a voltage to an electrode disposed between the quantum dots, and by utilizing extension or contraction of a depletion layer under the electrode. Changing the coupling state allows quantum calculation.

[D] The electronic device of [A], comprising a horizontal quantum dot structure, or a vertical quantum dot structure. The horizontal quantum dot structure utilizes a two-dimensional electron gas (2DEG) generated at a heterojunction interface such as a double heterojunction interface between a gallium arsenide and an aluminum gallium arsenide, and a double heterojunction interface between a silicon and a silicon germanium. In the vertical quantum dot structure, a double heterojunction interface is geometrically cut out, and an electrode is disposed therearound.

[E] The electronic device of [A], [B], [C], and [D], wherein a similar effect is achieved when a ferromagnetic metal (Co, Ni, Fe, Cr, Py, Dy, Cd), an alloy of these metals, or an oxide ferromagnetic metal [$TiO_2$, SrO, $MnO_2$, LaO, (La, Sr)O] is used as the ferromagnetic magnet. When a perfect diamagnetic material such as a superconductor (Nb, NbTi, NbN) and an oxide superconductor (SrCuO) is used, a magnetic field direction is reversed, but a similar effect is also expected to be achieved.

[F] The electronic device of [A], [B], [C], and [D], wherein a similar effect is expected to be achieved when a thickness and/or a layout of the ferromagnetic magnet are changed.

[G] The electronic device of [A], [B] [C], and [D], wherein a similar effect is expected to achieved when the dielectric film is disposed between the ferromagnetic magnet and the control electrode/the gate electrodes for forming quantum dots, as long as the thickness of the dielectric film is thin enough. The dielectric film can be selected widely from an electron beam lithography resist, a photolithography resist and the like.

[H] The electronic device of [A], [B], [C], and [D], wherein when a quantum dot is scalable, the dimension of the ferromagnetic magnet and the thickness of the dielectric film are controllable, so the device becomes scalable as a whole.

[I] The electronic device of [A], [B], [C], and [D], further comprising a quantum point contact disposed in the vicinity of the quantum dots, the a quantum point contact having a feature of exhibiting a one-dimensional quantized transmission phenomenon, wherein the quantum point contact changes its conductivity by sensing changes in the number of electrons in the quantum dots, so that small changes in a electron state can be measured, and wherein, in combination with the ferromagnetic magnet, electron spin in a polarized state can be injected into the quantum dot, as the Stern-Gerlach experiment.

BEST MODE FOR CARRYING OUT THE INVENTION

The electronic device using quantum dots in accordance with the present invention comprises a ferromagnetic magnet disposed in the vicinity of each quantum dot of a plurality of aligned semiconductor quantum dots and transforming a high frequency electric field into a high frequency magnetic field, wherein the ferromagnetic magnet is a ferromagnetic thin film that is disposed on the quantum dots with a dielectric material therebetween.

Embodiments

Embodiments of the present invention will be described in more detail below.

An electronic device with two semiconductor quantum dots will be used in the embodiments.

Figure 1:
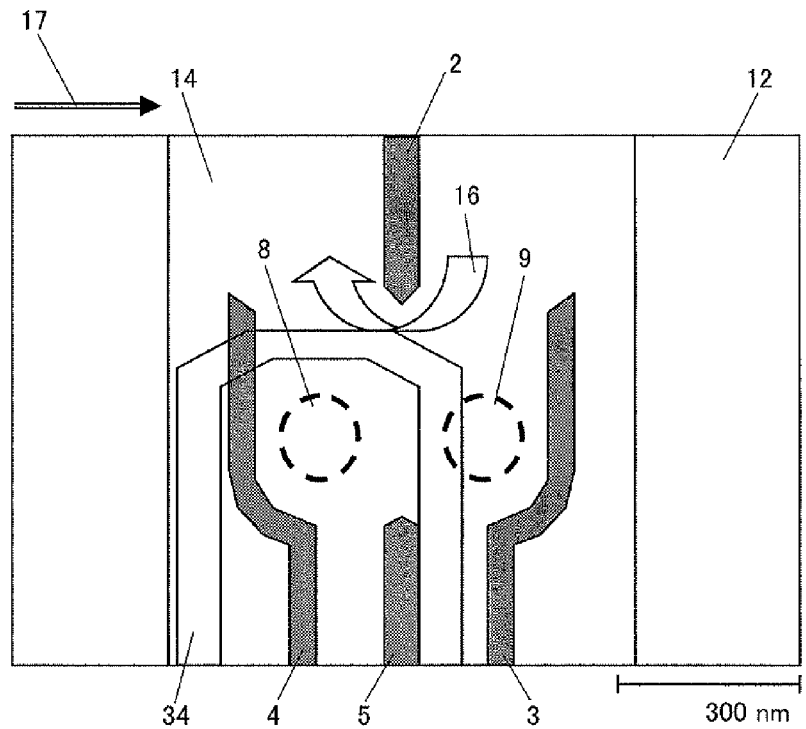
FIG. 1 shows a top view of a conventional electronic device using quantum dots.
Figure 2:
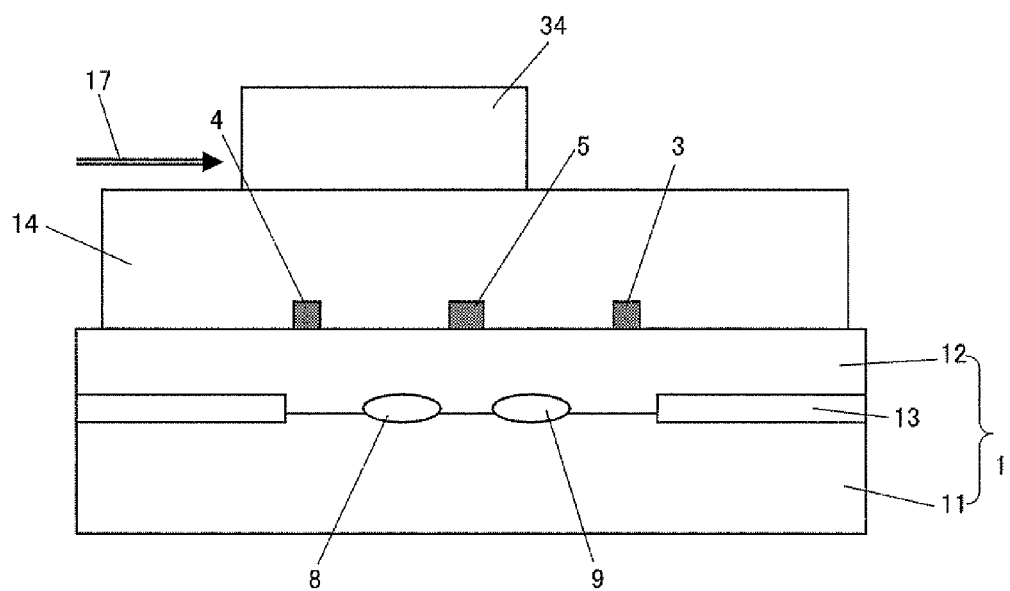
FIG. 2 shows a side view of a conventional electronic device using quantum dots.
Figure 3:
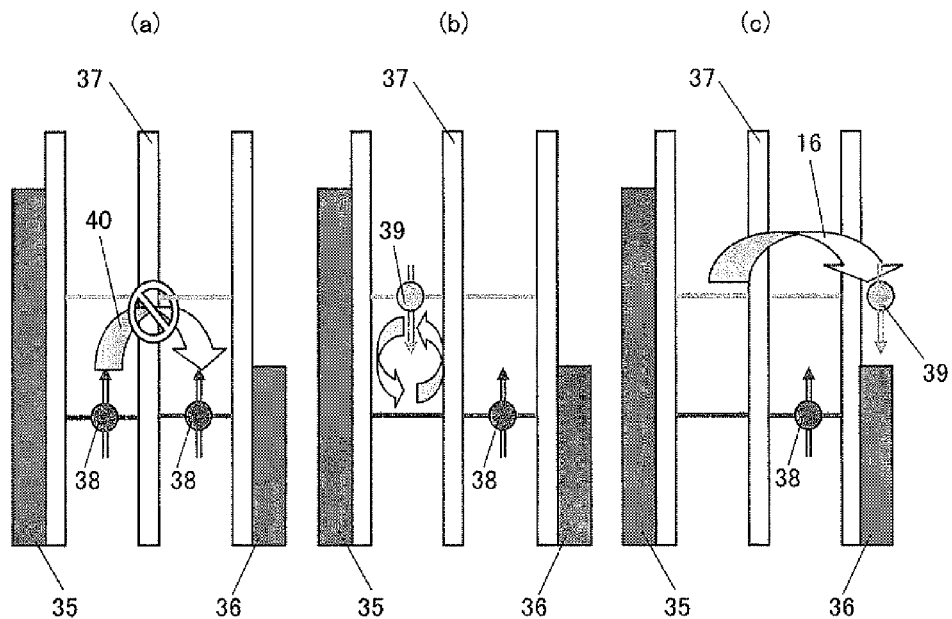
FIG. 3 shows energy diagrams of ESR control using conventional electron spin block.
Figure 4:
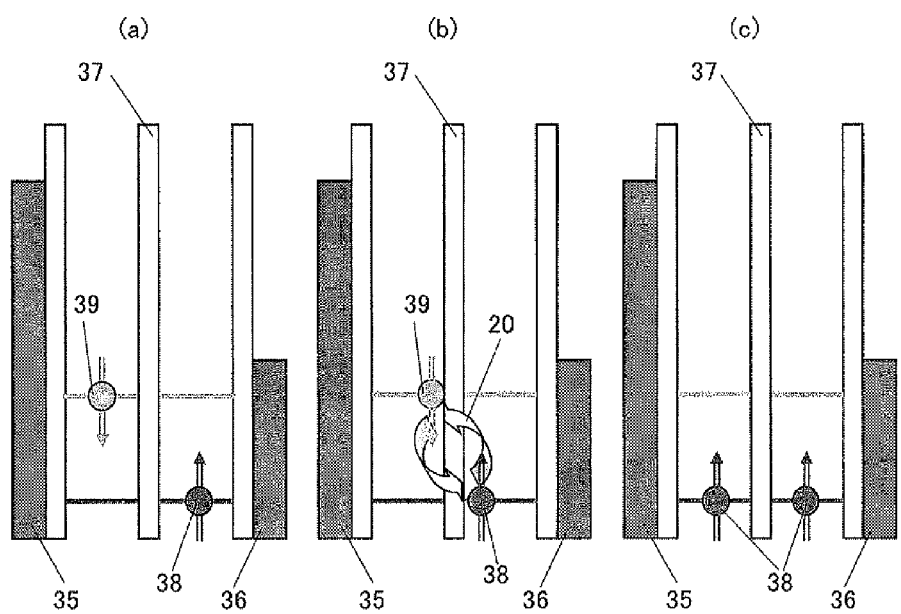
FIG. 4 shows energy diagrams of conventional electron spin information transfer.
Figure 5:
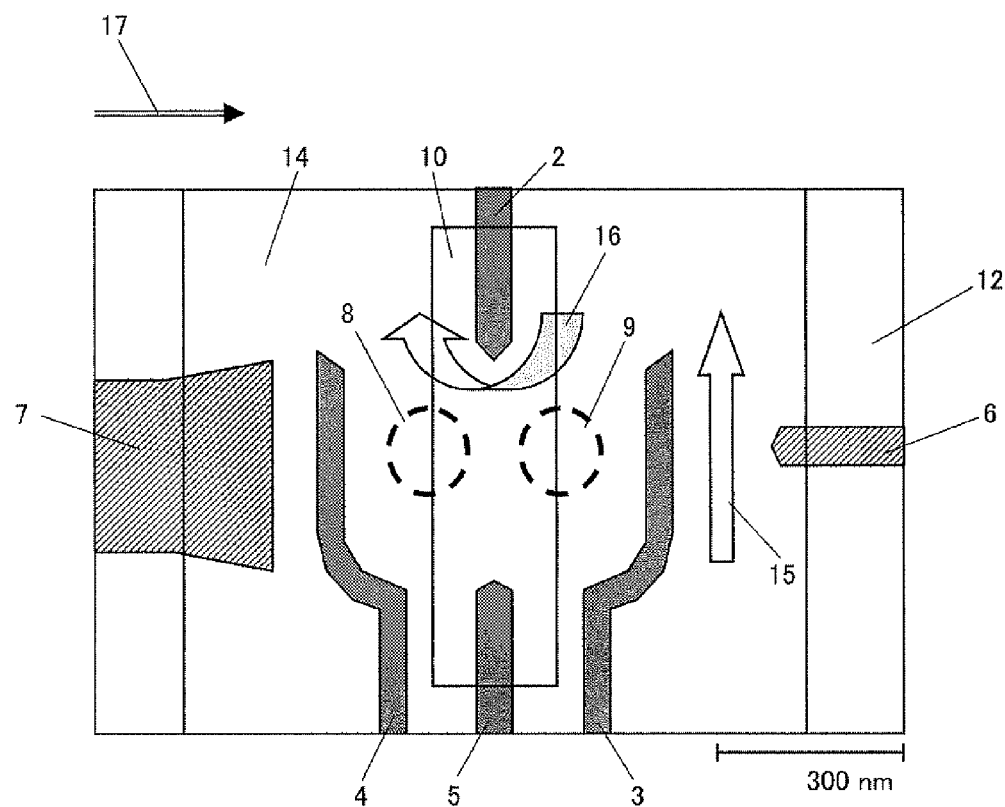
FIG. 5 shows a schematic top view of a pattern of an electronic device using a horizontal two-quantum dot structure in accordance with the first embodiment of the present invention.
Figure 6:
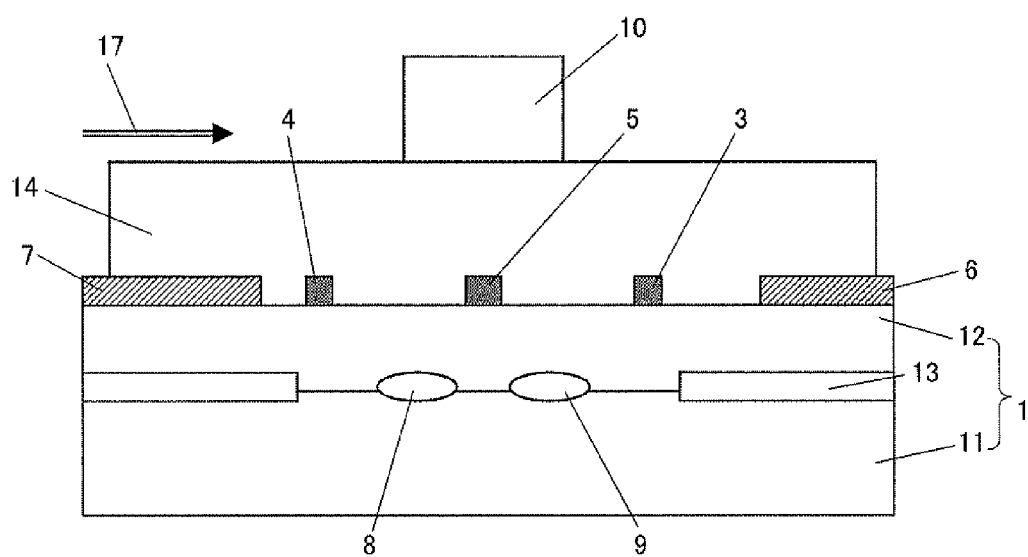
FIG. 6 shows a schematic cross-sectional view of an electronic device using horizontal two-quantum-dot structure in accordance with the first embodiment of the present invention.

FIG. 5 shows a schematic top view of an electronic device using a horizontal two-quantum-dot structure in accordance with the first embodiment of the present invention. FIG. 6 shows a cross-sectional view of the electronic device. In FIGS. 5 and 6, identical components are given the same reference signs as in FIGS. 1 and 2, so the repetition of the same description will be avoided here.

A calixarene insulating film 14 is deposited on a semiconductor crystal substrate 1. A ferromagnetic micro magnet 10 that transforms a high frequency electric field into a high frequency magnetic field is formed on the calixarene insulating film 14 by the electron beam vacuum evaporation method, so as to be 90 nm away from the surfaces of the gate electrodes 2, 3, 4, and 5. Thus, a ferromagnetic thin film is formed as the ferromagnetic micro magnet 10. Adjusting voltages applied to the gate electrodes 2, 3, 4, and 5 allows both quantum dots 8 and 9 to have only a single electron. 15 shows a quantum point contact current (QAC current).

The electronic device shown in FIG. 5 is mounted on a sample holder of a dilution refrigerator, and the sample is cooled down to 100 mK (millikelvin). An external magnetic field 17 of 25 T (tesla) is applied in order to fix an energy state of electron spin. In this state, an electron spin blocked state is realized as described in (A) in Background Art, and no current flows unless electron spin resonance occurs.

Figure 7:
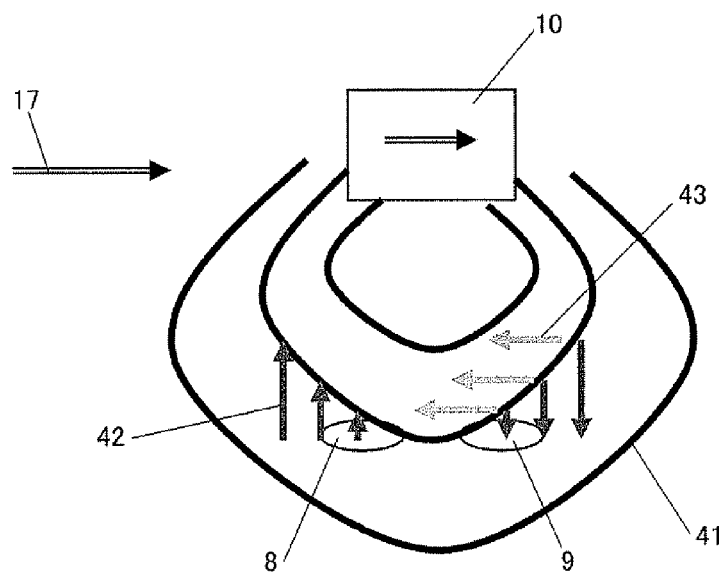
FIG. 7 shows a spatial distribution of a gradient magnetic field component and a parallel magnetic field component generated by a ferromagnetic micro magnet in accordance with the present invention.

FIG. 7 shows a magnetization state of the ferromagnetic micro magnet 10 under a strong magnetic field intensity along with a spatial distribution of a parallel magnetic field component 43 and a gradient magnetic field component 42 generated by this magnetization onto the surfaces of the quantum dots 8 and 9. 41 shows magnetic lines of force produced by the ferromagnetic micro magnet 10.

Figure 8:
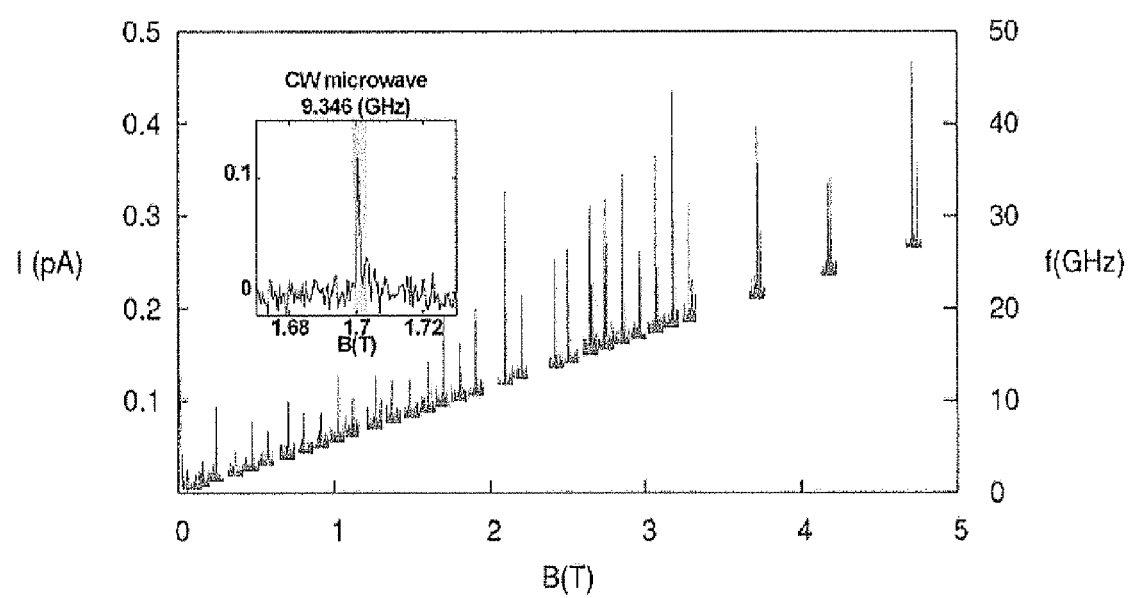
FIG. 8 shows a result of an ESR resonance experiment with a magnetic field intensity changing from 0 to 5 T in accordance with the present invention.
Figure 9:
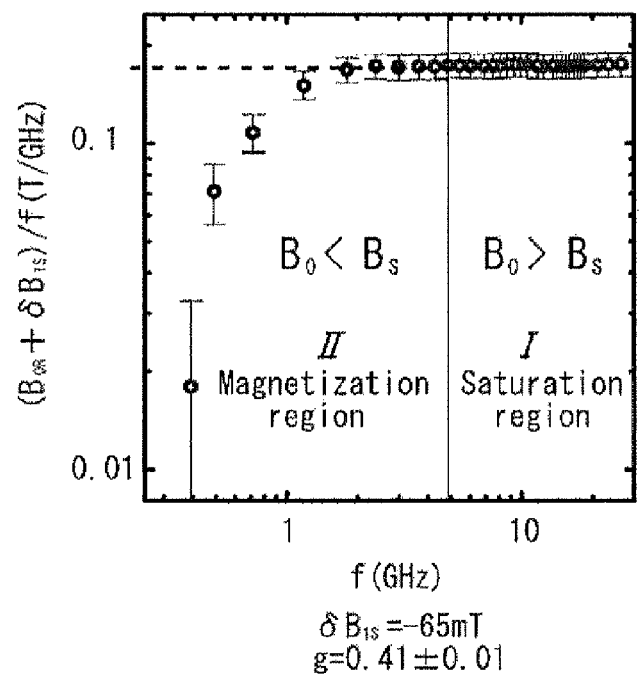
FIG. 9 shows a diagram illustrating a relationship between a resonant frequency and a resonance magnetic field intensity in accordance with the present invention.

The electron spins in the quantum dots 8 and 9 are driven electrically by applying a high frequency electric field with a frequency from 1.6 GHz to 300 GHz as shown in FIG. 8 and FIG. 9, or more specifically a frequency from 1.6 GHz to 3 GHz or from 3 GHz to 30 GHz as shown in FIG. 8, or a frequency from 30 GHz to 300 GHz as shown in FIG. 9 to an electrode for applying an ESR signal (a high frequency electrode) 7. The direction of this electron oscillation is parallel to the external magnetic field 17 and perpendicular to the gradient magnetic field component 42. When the electrons in the quantum dots 8 and 9 are perturbed under the gradient magnetic field component 42 generated by the ferromagnetic micro magnet 10 disposed in the vicinity of the quantum dots 8 and 9, the electrons feel an effective high-frequency magnetic field which changes in the up and down directions of FIG. 7. Since the direction of stationary electron spin is parallel to the external magnetic field 17 and the oscillation direction, when the electrons oscillate, the electron spins feel a couple (torque) in the direction deviating from the parallel direction according to the electromagnetic theory. The couple gives rise to a precession to the electron spins in the ESR control, and periodically reverses the direction of the electron spin. It is always possible to reverse the electron spins by 180 degrees by controlling the oscillation period of the electrons.

FIG. 8 shows a result of a series of observations of ESR resonance peaks in accordance with the present invention. The vertical axis shows a current in pA, and the horizontal axis represents magnetic field intensity in T. The inset of FIG. 8 shows an enlarged view illustrating a resonance state under an applied magnetic field intensity of 1.7 T. In order to show linear responsiveness of the resonance clearly, an offset of the base line is adjusted. The height of the base line of each resonance peak corresponds to the resonant frequency (GHz) given to the right vertical axis. The ESR control method used in the present method is performed with a power consumption more than 10 times lower than the method using a micro coil described above in Background Art, and more than 5 times lower than the conventional method in which microwaves are introduced directly into a control electrode.

FIG. 9 shows a diagram illustrating a relationship between resonance magnetic field intensities and resonant frequencies in accordance with the present invention. The resonance point increases linearly with magnetic field intensities at high magnetic field intensities, but at low magnetic field intensities, it does not change linearly due to an influence of the ferromagnetic micro magnet. When the resonance magnetic field intensities shown in the vertical axis are calibrated by small amounts and then divided by the resonant frequency (GHz) shown in the horizontal axis, the resonance in high resonant frequency region clearly shows a constant linear relationship. On the other hand, in the lower magnetic field intensity region, a gradual decrease is observed. This calibration amounts indicate a parallel magnetic field component 43 generated by the ferromagnetic micro magnet 10. That is, the calibration amounts show a magnetization process of the ferromagnetic micro magnet 10 due to the external magnetic field. FIG. 9 indicates that the ferromagnetic micro magnet 10 is perfectly magnetized at the external magnetic field intensity of approximately 2 T and more.

The parallel magnetic field component 43 that is parallel to the external magnetic field and is generated by the ferromagnetic micro magnet 10 is added to or subtracted from the external magnetic field 17, and slightly modulates electron spin energy by the amount of approximately 1 to 10%. This means that the electron spin energy can be changed by modifying the structure of the ferromagnetic micro magnet 10.

Figure 10:
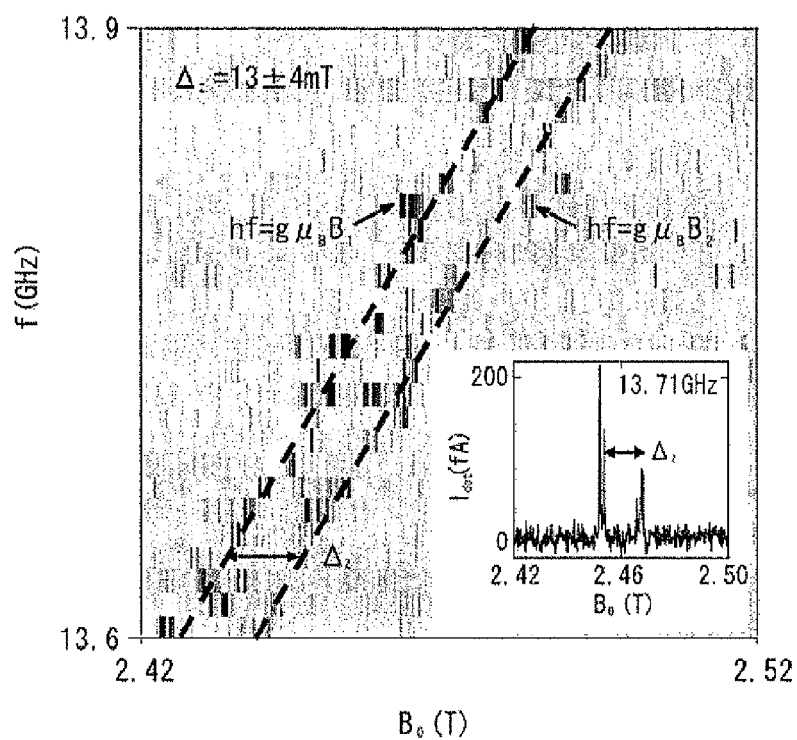
FIG. 10 shows a graph indicating observation results of ESR resonance in accordance with the present invention.

The magnitude of the parallel magnetic field component 43 changes depending on the degree of the magnetization. In a case of a perfect magnetization, the magnitude of the parallel magnetic field component 43 that is parallel to the external magnetic field 17 slightly changes depending on its position, so that the resonance magnetic field intensity can be changed by the positions of the quantum dots 8 and 9. FIG. 10 shows a graph indicating observation results of ESR resonance. Each peak shows resonance of each of the quantum dots 8 and 9. A current flows when electron spin in one of the quantum dots is resonant with ESR. That is, an ESR signal for each quantum dot is measured at different frequencies, and that individual ESR control can be performed by selecting a different frequency for each quantum dot. In FIG. 8, the two-peak structure is not observed (or the signal is too small) at the external magnetic field intensity of 2 T or less. It seems this is due to imperfect magnetization of the ferromagnetic micro magnet 10 in the lower magnetic field intensity region, and a small magnitude of the parallel magnetic field component 43, as shown in FIG. 9.

A quantum bit (QUBIT) which is necessary for quantum calculation can be realized in combination with the swapping operation described in (B) in Background Art, in accordance with the second embodiment of the present invention.

A quantum calculation method will be shown more specifically below.

Figure 11:
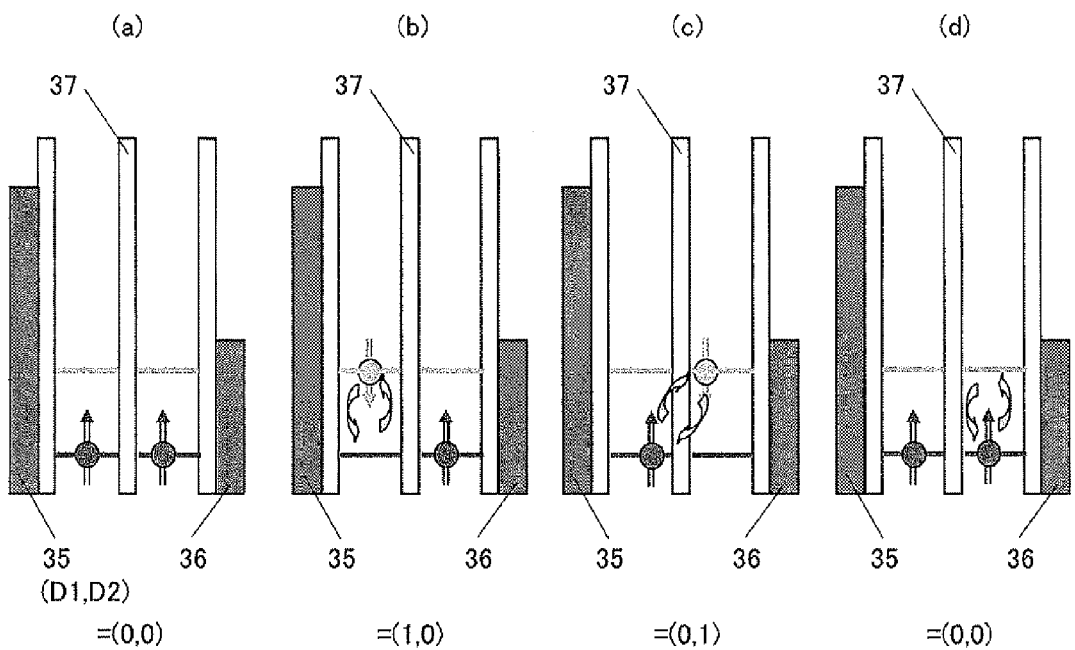
FIG. 11 shows a diagram illustrating a transfer of a quantum dot state in accordance with the present invention.

FIG. 11 shows a diagram illustrating a transfer of a quantum dot state in accordance with the present invention.

Each electron spin state is expressed by numerals "0" and "1", where "0" is a state in which electron spin is parallel to the external magnetic field 17 (a ground state), and "1" is a state in which the electron spin is reversed (an excited state). Each electron spin state is expressed, from left, as (D1, D2). Initialization is first performed by waiting for a time approximately equal to the relaxation time under a static magnetic field. In this state, each electron spin is in the spin-up state, that is (0, 0) as shown in FIG. 1(a). Then, a high frequency electric field is applied to the electrode for applying an ESR signal (a high frequency electrode) 7 (see FIGS. 5 and 6) to reverse a given electron spin by the ESR control. A resonance magnetic field intensity and a resonance frequency are selectable as shown in the above description. The electron spin in the left quantum dots is assumed to be reversed for simplicity of description. In other words, the electron spin state becomes (1, 0), as shown in FIG. 11 (b). Then, a pulse is applied to the quantum dot coupling control electrode 2 or the center gate electrode 5 to realize a correlation and interaction between the quantum dots. More specifically, the voltage applied to the electrode is decreased instantaneously, which makes the quantum dots to spatially approach to each other and interact with each other. Information of the electron spins is transferred, and the electron spins are reversed, this state is (0, 1) shown in FIG. 11 (c). The electron spin in the right quantum dot is reversed by the ESR control to create a (0, 0) state shown in FIG. 11 (d). In this state, no current flows due to the electron spin block. That is, no current flows when the ESR input signals are applied to both quantum dots. Similarly, current flows when the input signal is applied to one of the dots. When no input signal is applied and only an interaction is performed, no current flows. These four states of the quantum bits are shown to be equivalent to the CNOT or XOR operation.

The initial state (0, 0) is changed to (1, 0) by the ESR control, and then changed to (0, 1) by the interaction. The latter operation indicates that the information of the quantum bit is transferred from the left dot to the right dot by one bit, which indicates a basic operation of flip-flop calculation.

Figure 12:
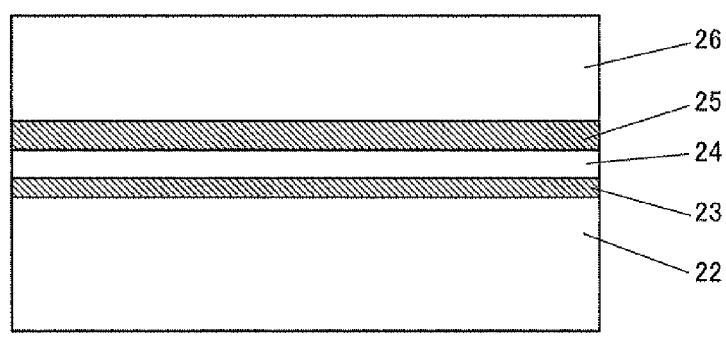
FIG. 12 shows a schematic cross-sectional view of a semiconductor crystal substrate for fabricating a vertical two-quantum-dot structure in accordance with the third embodiment of the present invention.
Figure 13:
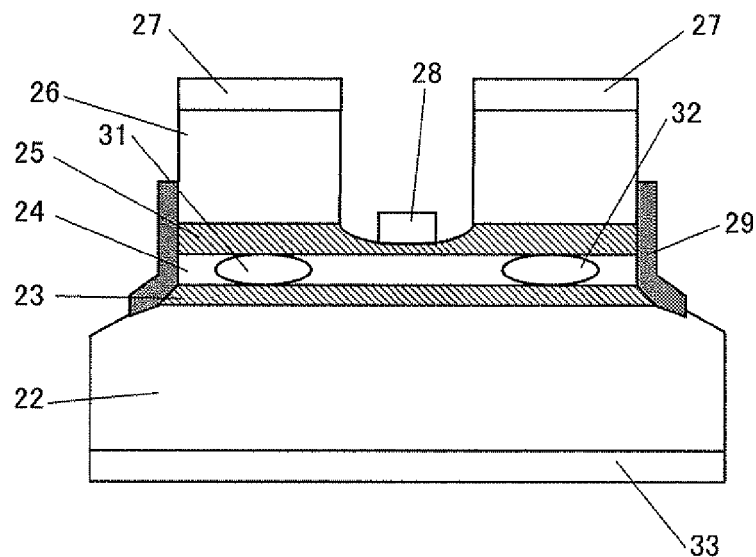
FIG. 13 shows a cross-sectional view of an electronic device using a vertical two-quantum-dot structure in accordance with the third embodiment of the present invention.
Figure 14:
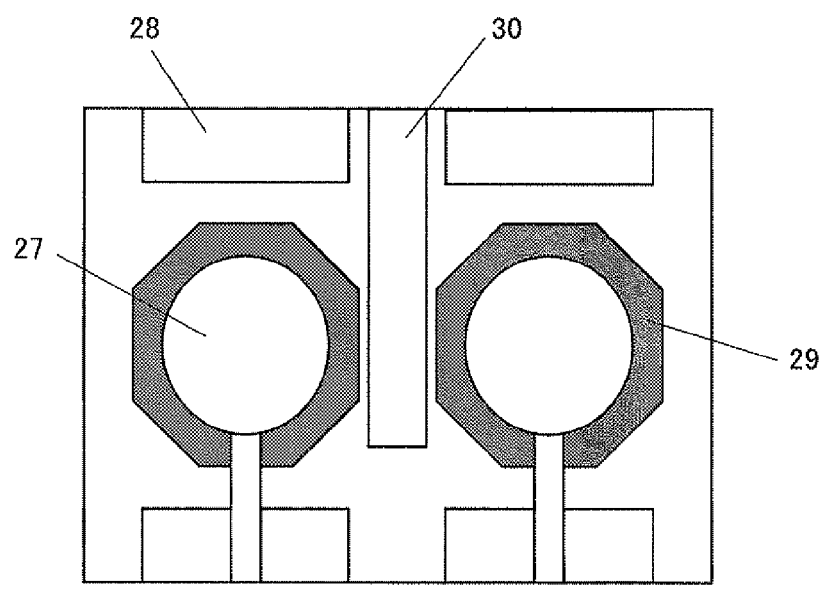
FIG. 14 shows a schematic top view of an electronic device using a vertical two-quantum-dot structure in accordance with the third embodiment of the present invention.

The invention can be applied not only to the horizontal quantum dot structure described above but also to a vertical quantum dot structure in accordance with the third embodiment of the present invention. FIG. 12 shows a schematic cross-sectional view of a semiconductor crystal substrate for fabricating a vertical two-quantum-dot structure in accordance with the third embodiment of the present invention. FIG. 13 shows a cross-sectional view of an electronic device using a vertical two-quantum-dot structure in accordance with the third embodiment of the present invention. FIG. 14 shows a schematic top view of an electronic device using a vertical two-quantum dot structure in accordance with the third embodiment of the present invention.

In the vertical quantum dot structure, an AlGaAs crystal layer 23 with a thickness of 10 nm, a GaAs crystal layer 24 with a thickness of 10 nm, an AlGaAs crystal layer 25 with a thickness of 10 nm, and a GaAs ($n^+$) crystal layer 26 with a thickness of 350 nm are sequentially grown on an N—GaAs crystal substrate 22 by the epitaxial crystal growth method as shown in FIG. 12. A 2DEG layer is formed within the GaAs crystal layer 24. A pattern for a quantum dot with a size of 0.3 µm in diameter is fabricated on the semiconductor crystal substrate, and then etched down to the substrate by a suitable etching method to fabricate a mesa as shown in FIG. 13. By evaporating gate electrodes (electrodes for forming quantum dots) 29 such as Au, Al on the surfaces of the quantum dots 31 and 32, Schottky barriers are fabricated on the side surfaces of the quantum dots 31 and 32. A metal such as Au/Ge is evaporated and alloyed on the top surfaces of the quantum dots and the rear surface of the substrate to form, respectively, an upper ohmic electrode 27 for quantum dots and a lower ohmic electrode 33 for quantum dots. In addition, in the vicinity of each quantum dot 31 and 32, a ferromagnetic metal such as Co and Ni or a ferromagnetic metal oxide film is deposited as a ferromagnetic micro magnet 28. The distance between the ferromagnetic micro magnet 28 and each semiconductor quantum dot 31 and 32 varies from 0.15 µm to 0.5 µm, and the thickness of the ferromagnetic micro magnet 28 is 0.1 µm, for example. Controlling the voltage applied to the gate electrode 29 allows each quantum dot 31 and 32 to have only a single electron. Controlling the voltage applied to the quantum dot coupling control electrode 30 also allows control of an interaction (coupling state) of the electron spins between the quantum dots 31 and 32. Like the horizontal quantum dot structure described in the first and second embodiments, a vertical quantum dot structure of this type can also achieve the effect of the ESR control of each quantum dot by the ferromagnetic micro magnet 28.

The above embodiments are described by using a device with two quantum dots as examples, but the same theory can be applied to a device with three or more quantum dots.

In accordance with the fourth and the fifth embodiments of the present invention, changing a layout and a pattern geometry of a ferromagnetic micro magnet with respect to each quantum dot allows ESR control of each quantum dot to be controlled precisely by using different frequencies.

Figure 15:
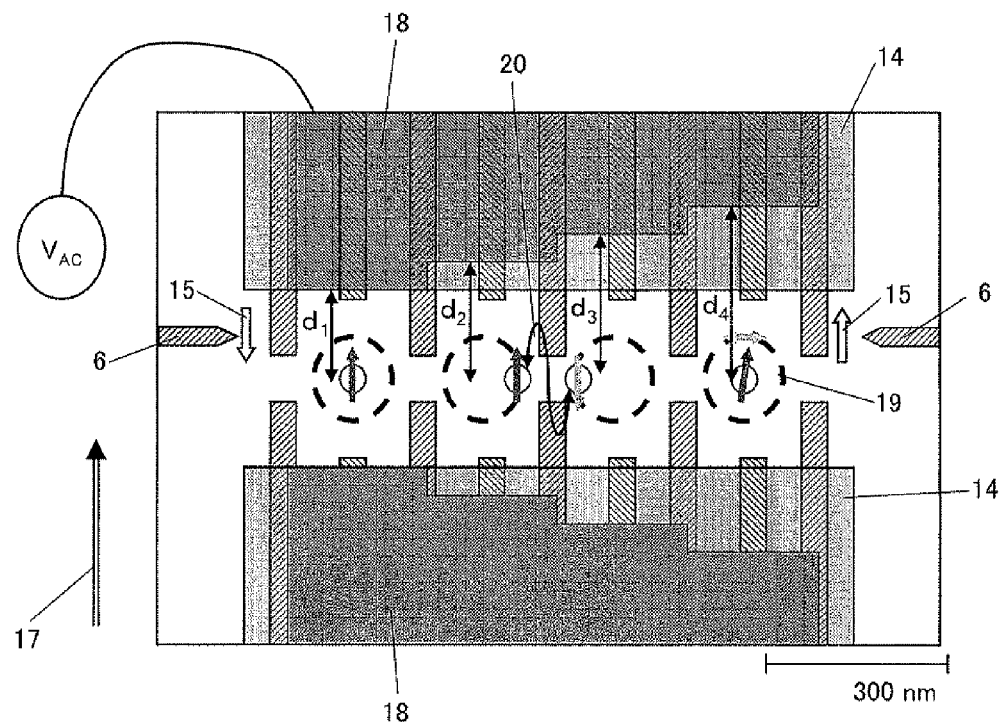
FIG. 15 shows a first conceptional schematic diagram of multiple quantum bits having a micro magnet in accordance with the fourth embodiment of the present invention.
Figure 16:
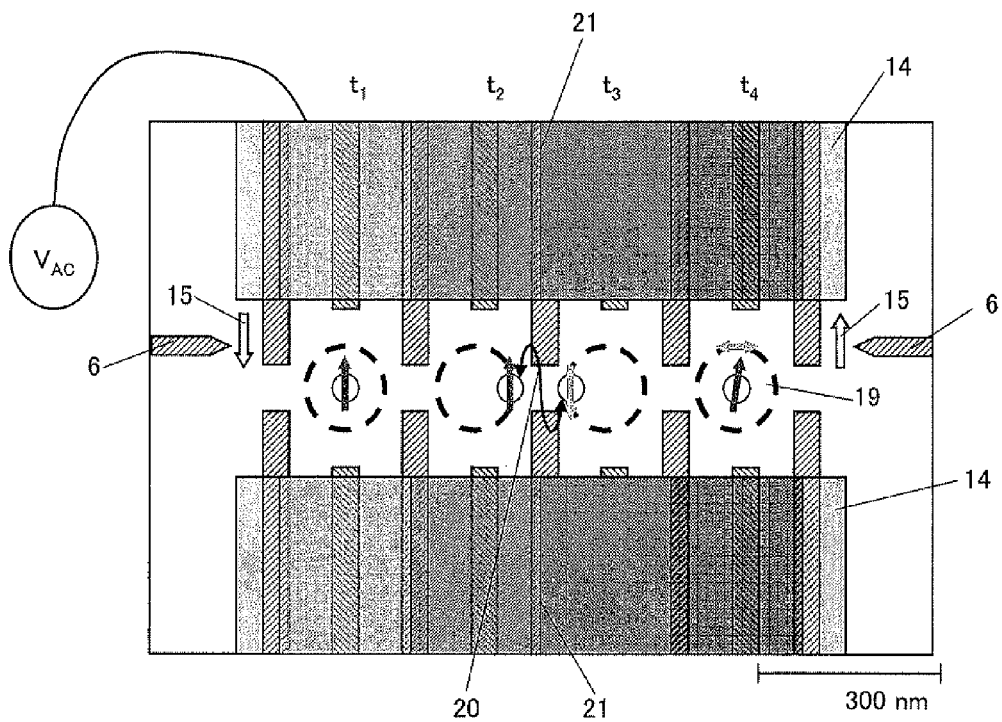
FIG. 16 shows a second conceptional schematic diagram of multiple quantum bits having a ferromagnetic micro magnet in accordance with the fifth embodiment of the present invention.

FIG. 15 shows a first schematic conceptional diagram of multiple quantum bits having a ferromagnetic micro magnet in accordance with the fourth embodiment of the present invention. FIG. 16 shows a second schematic conceptional diagram of multiple quantum bits having a ferromagnetic micro magnet in accordance with the fifth embodiment of the present invention.

As shown in FIG. 15, a stair-shaped micro magnet 18 that is a ferromagnetic micro magnet is disposed to be symmetrical with respect to a quantum dot array 19, such that each stair-step shaped surface of the stair-shaped micro magnet 18 faces the quantum dot array 19. A distance from the center line of the quantum dot array 19 to each of the stair-step shaped surface varies from $d_1$ to $d_4$. Use of this configuration has confirmed that a gradient magnetic field component with a magnitude large enough for ESR to be observed can be obtained. For example, in a case where Co is used as a metal of the stair-shaped micro magnet 18, a preferable thickness of a Co film is from 0.05 µm to 1 µm, its preferable width is from 0.3 µm to 0.4 µm, and its preferable length is 1 µm. In a case where Ni is used, a preferable thickness of a Ni film is from 0.15 µm to 3 µm, its preferable width is 0.3 µm to 0.4 µm, and its preferable length is 1 µm. In a case where Dy (dysprosium) is used, a preferable thickness of a Dy film is from 0.025 µm to 1 µm, its preferable width is from 0.3 µm to 0.4 µm, and its preferable length is 1 µm. In a case where Fe is used, a preferable thickness of a Fe film is from 0.025 µm to 1 µm, its preferable width is from 0.3 µm to 0.4 µm, and its preferable length is 1 µm. In a case where Cr is used, a preferable thickness of a Cr film is from 0.025 µm to 1 µm, its preferable width is 0.3 µm to 0.4 µm, and its preferable length is 1 µm.

In a case where an applied magnetic field intensity is 2 T, a resonant frequency can be changed by about 0.6 GHz when the distance $d_1$ is 0.035 µm or 35 nm. The resonant frequency can be changed by about 0.64 GHz when the distance $d_2$ is 45 nm.

In accordance with the fifth embodiment of the present invention, as shown in FIG. 16, when a micro ferromagnetic body 21 with a thickness of $t_1$, $t_2$, or $t_3$, ... is disposed instead, and a distance from the quantum dot array 19 to the micro ferromagnetic body 21 is equal, the same effect can be obtained. For example, in a case where an applied ESR magnetic field intensity is 2 T and a distance between the surface the ferromagnetic thin film and the quantum dot array 19 is 35 nm, magnetic field intensity can be varied a film thickness, for example, a film thickness of 150 nm gives a displacement magnetic field intensity of 100 mT, and a film thickness of 170 nm gives a displacement magnetic field intensity of 110 mT. Thus, making the film thickness of the ferromagnetic micro magnet in the vicinity of the quantum dot array 19 changeable allows each quantum dot to be resonant at a desired frequency. Although the ferromagnetic body is disposed symmetrically with respect to the quantum dot array 19 in FIG. 16, similar effects can be obtained by a non-symmetrical configuration or when a micro ferromagnetic body is disposed on one side.

In accordance with the sixth embodiment of the present invention, the device described in the first to fifth embodiments can be also applied when a dielectric film of different type is used. In other words, the same effects can be expected when a dielectric film such as an electron beam lithography resist (PMMA, OEBR, ZEP), a photoresist (S1800, AZ5200), silicon dioxide, silicon nitride and the like are used.

In accordance with the seventh embodiment of the present invention, exactly the same effect can be expected just by increasing or decreasing the operating voltage, even when the size of the quantum dots in the device described in the first to fifth embodiments is increased or decreased. The electronic device is scalable since substantially the same effect can be expected only by changing a thickness and shape of a micro ferromagnetic body (a ferromagnetic micro magnet).

In accordance with the eighth embodiment of the present invention, providing the input and output ends of the semiconductor quantum dot array with the readout quantum point contact electrode 6 (see FIGS. 5, 15, and 16) that measures a quantum point contact current (QPC current 15: $I_{QPC}$) allows readout of a respective electric charge state without changing the electron spin state.

When moving an electron after quantum calculation as shown in the second embodiment, for example, when transferring the electrons in the electron spin state of (1, 0) to another state of different electron numbers, the QPC current 15 is changed. The result of the quantum calculation can be indirectly observed by measuring the QPC current 15.

Writing into the quantum dots becomes feasible at the input end by providing a quantum point contact structure and a ferromagnetic micro magnet in the close vicinity of the input end of the quantum dots. That is, a QPC current is disposed in the close vicinity of the input end of the quantum dot and a ferromagnetic micro magnet is disposed in between. A current passing through the quantum point contact changes its trajectory due to the ferromagnetic micro magnet, but the amount of the change depends on the electron spin state as demonstrated by the result of the Stern-Gerlach experiment. In this way, the electron spin state at the input end becomes selectable. Of course, when it is not necessary to fix the electron spin state, the quantum point contact may be removed. In such a case, an electron can be injected into the quantum dot irrespective of its trajectory and the electron spin state.

The same effect can be expected when, in addition to GaAs and AlGaAs described above, InP, InAs, GaSb, Si and the like, or mixed crystal of thereof is used for a semiconductor crystal substrate.

An interaction 20 (see FIGS. 15 and 16) between electron spins is changd freely by high speed operation of the gate voltage in order to enable quantum calculation.

The present invention is not limited to the above embodiments. Various variations and modifications can be made based on the spirit of the present invention, and these are not excluded from the scope of the present invention.

The present invention provides the following advantages.

The present invention provides an electronic device using quantum dots, which comprises a ferromagnetic magnet, and enables quantum calculation by performing ESR control, in more power saving way than conventional ways, individually on each multiple-quantum bit having a quantum bit array, which can not be achieved by the prior art.

Specifically demonstrated cases shows that the Zeeman level in quantum dots can be modulated precisely and with a identifiable magnitude by a ferromagnetic magnet disposed in the vicinity of the quantum dots, and that ESR control of the electron spins in the quantum dots can be performed precisely since a gradient magnetic field transforms a high frequency electric field into a high frequency magnetic field. It is also demonstrated that each quantum dot can be controlled with different resonant frequencies since the magnitude of modulation of the Zeeman energy as described above can be controlled by changing the intensity of the ferromagnetic magnet. As a result, an electric power required for the ESR control becomes about ten times lower than that of conventional ways. Thus, the present invention enhances the possibility of quantum calculation by individual ERS control, which has been deemed impossible by the conventional techniques.

Industrial Applicability

The electronic device using quantum dots, which comprises a ferromagnetic micro magnet, in accordance with the present invention, can be used as an electronic device that realizes quantum calculation by performing ESR control on each multiple-quantum bit individually in a power saving way.

The invention claimed is:

1. An electronic device using quantum dots, comprising:
a plurality of aligned semiconductor quantum dots formed in a semiconductor crystal substrate;
a plurality of gate electrodes formed on a surface of the semiconductor substrate;
an electrode for applying an ESR signal;
a dielectric film formed on the semiconductor crystal substrate;
a single ferromagnetic micro magnet formed on a surface of the dielectric film and above the semiconductor quantum dots, the magnet being a ferro magnetic thin film and transforming a high frequency electric field to a high frequency magnetic field; and
a control electrode disposed halfway between the quantum dots, wherein a coupling state of electrons is controlled by applying a voltage to the control electrode to extend or contract a depletion layer under the control electrode.

2. The electronic device of claim 1, wherein a frequency of the high frequency electric field is 1.6 GHz and more and 300 GHz or less.

3. The electronic device of claim 2, wherein a frequency of the high frequency electric field is 1.6 GHz and more and 3 GHz or less.

4. The electronic device of claim 2, wherein a frequency of the high frequency electric field is 3 GHz and more and 30 GHz or less.

5. The electronic device of claim 2, wherein a frequency of the high frequency electric field is 30 GHz and more and 300 GHz or less.

6. The electronic device of claim 1, wherein the ferromagnetic thin film is made from cobalt or cobalt alloy containing 50% and more of cobalt.

7. The electronic device of claim 6, wherein a thickness of the ferromagnetic thin film is from 0.05 µm to 1 µm, a width of the ferromagnetic thin film is from 0.3 µm to 0.4 µm, and a length of the ferromagnetic thin film is 1 µm.

8. The electronic device of claim 1, wherein the ferromagnetic thin film is made from nickel or nickel alloy containing 50% and more of nickel.

9. The electronic device of claim 8, wherein a thickness of the ferromagnetic thin film is from 0.15 µm to 3 µm, a width of the ferromagnetic thin film is from 0.3 µm to 0.4 µm, and a length of the ferromagnetic thin film is 1 µm.

10. The electronic device of claim 1, wherein the ferromagnetic thin film is made from dysprosium or dysprosium alloy containing 50% and more of dysprosium.

11. The electronic device of claim 10, wherein a thickness of the ferromagnetic thin film is from 0.025 µm to 1 µm, a width of the ferromagnetic thin film is from 0.3 µm to 0.4 µm, and a length of the ferromagnetic thin film is 1 µm.

12. The electronic device of claim 1, wherein the ferromagnetic thin film is made from iron or iron alloy containing 50% and more of iron.

13. The electronic device of claim 12, wherein a thickness of the ferromagnetic thin film is from 0.025 µm to 1 µm, a width of the ferromagnetic thin film is from 0.3 µm to 0.4 µm, and a length of the ferromagnetic thin film is 1 µm.

14. The electronic device of claim 1, wherein the ferromagnetic thin film is made from chromium or chromium alloy containing 50% and more of chromium.

15. The electronic device of claim 14, wherein a thickness of the ferromagnetic thin film is from 0.025 µm to 1 µm, a width of the ferromagnetic thin film is from 0.3 µm to 0.4 µm, and a length of the ferromagnetic thin film is 1 µm.

16. The electronic device of claim 1, wherein a gradient magnetic field and a parallel magnetic field with respect to the surface of the quantum dots are generated due to a magnetic field generated by the ferromagnetic thin film.

17. The electronic device of claim 16, wherein an energy state of electron spin in each quantum dot is changed by applying a strong external magnetic field under an ultra-low temperature, and each quantum dot has an individual energy state by the action of the parallel magnetic field.

18. The electronic device of claim 16, wherein an electron disposed in the vicinity of the quantum dots are electrically driven under the influence of the gradient magnetic field, and electron spin resonance is realized.

19. The electronic device of claim 18, wherein an electron spin state can be manipulated to be a spin-up state and a spin-down state by the electron spin resonance, and the electron spin state is related to a bit, thereby setting a quantum bit.

20. The electronic device of claim 1, wherein each quantum dot has a different energy state by the action of the ferromagnetic magnet.

21. The electronic device of claim 1, wherein electron spin can be manipulated independently by applying a high frequency electric field with different frequency to each quantum dot, according to the electron spin resonance principle.

22. The electronic device of claim 1, wherein electrons present in the quantum dots mutually form an electronic coupling state.

23. The electronic device of claim 1, wherein quantum calculation is performed by manipulating the coupling state of electrons.

24. The electronic device of claim 1, wherein each quantum dot has a horizontal quantum dot structure with a gate electrode for forming a quantum dot, the gate electrode being disposed on a surface of a semiconductor crystal substrate, the substrate having a two-dimensional electron gas layer at a heterojunction interface between a gallium arsenide and an aluminum gallium arsenide.

25. The electronic device of claim 1, wherein each quantum dot has a horizontal quantum dot structure with a gate electrode for forming a quantum dot, the gate electrode being disposed on a surface of a semiconductor crystal substrate, the substrate having a two-dimensional electron gas layer at a heterojunction interface between a silicon and a silicon germanium.

26. The electronic device of claim 24, wherein each quantum dot has a vertical quantum dot structure in which the two-dimensional electron gas layer is geometrically cut out and a metallic electrode is disposed on the periphery of the cut out layer.

27. The electronic device of claim 1, wherein the ferromagnetic magnet is made from a ferromagnetic metal, an oxide ferromagnetic metal, a superconductive metal, or an oxide superconductive metal.

28. The electronic device of claim 1, wherein a distance from the ferromagnetic magnet to each semiconductor quantum dot is different.

29. The electronic device of claim 28, wherein the distance from the ferromagnetic magnet to each semiconductor quantum dot varies from 0.15 µm to 0.5 µm, and a thickness of the ferromagnetic magnet is 0.1 µm.

30. The electronic device of claim 1, wherein a thickness of the ferromagnetic magnet in the nearest neighborhood of each quantum dots is varied.

31. The electronic device of claim 30, wherein a thickness of the ferromagnetic magnet varies from 0.025 µm to 1 µm.

32. The electronic device of claim 1 wherein a dielectric film is disposed between the ferromagnetic magnet and the electrodes or the gate electrodes for forming a quantum dot.

33. The electronic device of claim 32, wherein the dielectric film is an electron beam lithography resist, a photoresist or silicon dioxide, or silicon nitride.

34. The electronic device of claim 1, wherein the dimensions of the ferromagnetic magnet, the control electrode, and the gate electrodes for forming a quantum dot are changed uniformly so as to provide the same function only by changing a magnitude of applied voltage.

35. The electronic device of claim 1, further comprising a control electrode, an electrode for forming a quantum dot, and a readout quantum point contact gate electrode in the vicinity of the semiconductor quantum dots, and further comprising a quantum point contact exhibiting one dimensional quantized electron conduction phenomenon.

36. The electronic device of claim 1, further comprising a quantum point contact which changes its conductivity depending on the number of electric charges in the neighboring quantum dots.

37. The electronic device of claim 1, wherein readout of an electron spin state is performed by means of detection of an electron coupling state between the quantum dots and an electric charge.

38. The electronic device of claim 1, wherein an electron spin polarized current utilizing electron spin alignment due to a leakage magnetic field can be injected in the vicinity of the ferromagnetic thin film.

39. The electronic device of claim 1, wherein a flip-flop operation can be performed by controlling an electron spin state of each quantum dot uniquely.

40. The electronic device of claim 17, wherein quantum calculation can be performed by controlling a coupling state between the electron spins.

* * * * *